United States Patent [19]
Osajima et al.

[11] Patent Number: 6,013,924
[45] Date of Patent: Jan. 11, 2000

[54] SEMICONDUCTOR INTEGRATED CIRCUIT AND METHOD FOR MAKING WIRING LAYOUT OF SEMICONDUCTOR INTEGRATED CIRCUIT

[75] Inventors: Toru Osajima; Noboru Yokota; Takashi Iida; Masashi Takase; Shigenori Ichinose, all of Kawasaki, Japan

[73] Assignee: Fujitsu Limited, Kawasaki, Japan

[21] Appl. No.: 08/880,443

[22] Filed: Jun. 23, 1997

[30] Foreign Application Priority Data

Dec. 25, 1996 [JP] Japan ..................................... 8-344350

[51] Int. Cl.$^7$ .................................................. H01L 27/118
[52] U.S. Cl. ........................... 257/203; 257/206; 257/786
[58] Field of Search ..................................... 257/202, 203, 257/204, 205, 48, 206, 207, 208, 773, 786

[56] References Cited

U.S. PATENT DOCUMENTS

| 4,811,073 | 3/1989 | Kitamura et al. | 257/203 |
|---|---|---|---|
| 4,975,758 | 12/1990 | Crafts | 257/203 |
| 5,760,428 | 6/1998 | Colwell et al. | 257/206 |
| 5,768,146 | 6/1998 | Jassowski | 364/491 |
| 5,777,354 | 7/1998 | Cheung et al. | 257/202 |

FOREIGN PATENT DOCUMENTS

| 62-179744 | 8/1987 | Japan . | |
| 2-25054 | 1/1990 | Japan . | |
| 4-15954 | 1/1992 | Japan | 257/203 |
| 4-174537 | 6/1992 | Japan . | |
| 7-60855 | 6/1995 | Japan . | |

*Primary Examiner*—Donald L. Monin, Jr.
*Attorney, Agent, or Firm*—Armstrong, Westerman, Hattori, McLeland & Naughton

[57] ABSTRACT

A semiconductor integrated circuit includes a semiconductor chip; an inner cell region; a plurality of input/output cell regions which are located around the inner cell region, and a plurality of pads which are provided between the plurality of input/output regions and sides of the semiconductor chip. Each unit area of the plurality of input/output cell regions is assigned to a corresponding input/output cell so as to be just sufficient for the corresponding input/output cell.

13 Claims, 17 Drawing Sheets

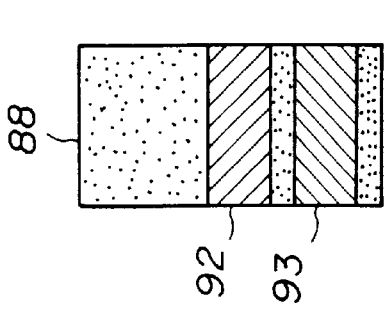
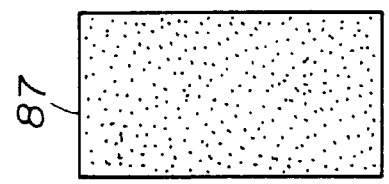
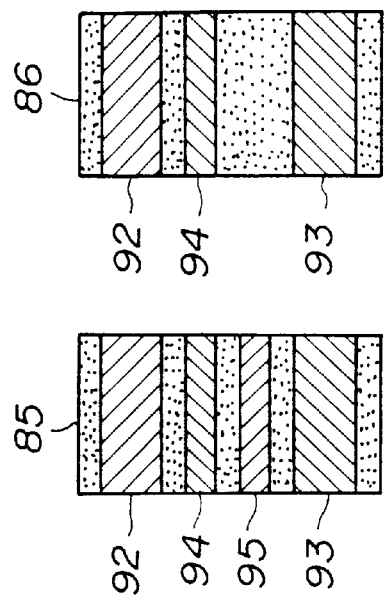
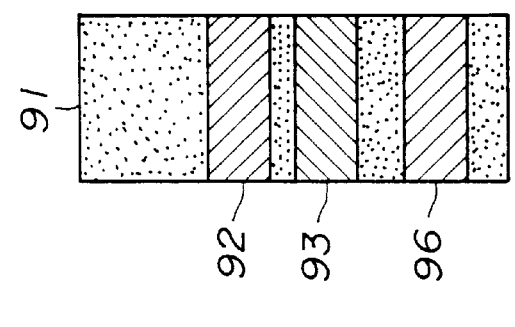
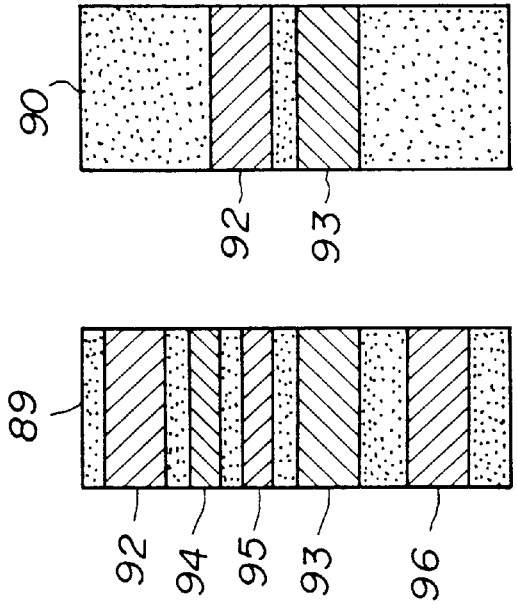

SEMICONDUCTOR INTEGRATED CIRCUIT AND METHOD FOR MAKING WIRING LAYOUT OF SEMICONDUCTOR INTEGRATED CIRCUIT

BACKGROUND OF THE INVENTION

The present invention generally relates to semiconductor integrated circuits and methods for making wiring layouts of semiconductor integrated circuits. More particularly, the present invention relates to a semiconductor integrated circuit, in which input/output cell regions are provided around an inner cell region and pads are provided between the input/output cell regions and the sides of the semiconductor integrated circuit, and a method for making a wiring layout of such a semiconductor integrated circuit.

FIG. 1 is a schematic diagram showing a plan view of an embodiment of a conventional semiconductor integrated circuit (hereinafter also referred to as SIC). As shown in FIG. 1, the SIC is comprised of a semiconductor chip (element) 1, a plurality of pads 2, a plurality of input/output cell regions 3 (hereinafter also referred to as I/O cell regions 3), and an inner cell region 4.

In the SIC shown in FIG. 1, the plurality of I/O cell regions 3, each I/O cell region 3 having an identical size, are provided around the inner cell region 4. Also, each I/O cell is formed by one or more of the I/O cell regions 3.

However, there is a need for various types of I/O cells in terms of function and, in the conventional SIC shown in FIG. 1, a problem exists in that the area required for a particular I/O cell does not always match the area formed by one or more of the I/O cell regions 3. Therefore, an area larger than the required area is usually used for an individual I/O cell, and hence the surface of the semiconductor chip 1 is not used efficiently nor effectively.

Also, in the conventional SIC shown in FIG. 1, a wiring layout is performed by using an I/O cell having a wiring pattern which is not necessary for itself but necessary for other I/O cells.

However, it is not easy to carry out such a layout method, and not much flexibility is available in the method.

SUMMARY OF THE INVENTION

Accordingly, it is a general object of this invention to provide semiconductor integrated circuits and methods for making a wiring layout of a semiconductor integrated circuit in which the above-mentioned problems are eliminated.

Another object of this invention is to provide a semiconductor integrated circuit in which a surface of a semiconductor chip is used effectively, and hence the area for an inner cell may be increased or the size of the semiconductor chip may be reduced.

Yet another object of this invention is to provide a method for making a wiring layout of a semiconductor integrated circuit by which the wiring layout may be performed easily.

The objects described above are achieved by a semiconductor integrated circuit comprising: a semiconductor chip; an inner cell region; a plurality of input/output cell regions which are located around the inner cell region, and a plurality of pads which are provided between the plurality of input/output regions and sides of the semiconductor chip, wherein each unit area of the plurality of input/output cell regions is assigned to a corresponding input/output cell so as to be just sufficient for the corresponding input/output cell.

According to the above semiconductor integrated circuit, since each unit area of the plurality of input/output cell regions is assigned to a corresponding input/output cell so as to be just sufficient for the corresponding input/output cell, the entire surface of the semiconductor chip may be used efficiently and effectively and it becomes possible to increase the area which may be assigned to the inner cell region provided that the surface area of the semiconductor chip is unchanged, or to reduce the surface area of the semiconductor chip provided that the area of the inner cell region is unchanged.

The objects described above are also achieved by the semiconductor integrated circuit, wherein additional input/output cell regions are provided in at least one corner of the semiconductor chip, the additional input/output cell regions being partially surrounded by input/output cell regions facing the corner.

According to the above semiconductor integrated circuit, since the additional input/output cell regions are provided in at least one corner of the semiconductor chip, the surface of the semiconductor chip may be used effectively and it becomes possible to increase the number of the input/output cell regions.

The objects described above are also achieved by the semiconductor integrated circuit, wherein input/output cell regions whose length of sides perpendicular to a respective orientation direction of the plurality of input/output cell regions are shorter compared with the corresponding length of sides of other input/output cells are located so as to be facing a respective corner of the semiconductor chip.

The objects described above are also achieved by the semiconductor integrated circuit, wherein the length of sides of each input/output cell region perpendicular to a respective orientation direction of the plurality of input/output cell regions is substantially equal to a multiple of the length of sides of the each input/output cell region parallel to a respective orientation direction of the plurality of input/output cell regions.

The objects described above are also achieved by the semiconductor integrated circuit, wherein the length of sides of each input/output cell region parallel to a respective orientation direction of the plurality of input/output cell regions is substantially the same as each other.

According to the above semiconductor integrated circuit, the entire surface of the semiconductor chip may be used efficiently and effectively and it becomes possible to increase the area which may be assigned to the inner cell region provided that the surface area of the semiconductor chip is unchanged, or to reduce the surface area of the semiconductor chip provided that the area of the inner cell region is unchanged.

The objects described above are also achieved by the semiconductor integrated circuit, wherein the length of sides of each input/output cell region perpendicular to a respective orientation direction of the plurality of input/output cell regions and a pitch of the plurality of pads, respectively, are a multiple of a predetermined length.

According to the above semiconductor integrated circuit, it becomes easy to connect input/output cells when fine patterning of the input/output cell regions is desired without changing the pitch of the plurality of pads.

The objects described above are also achieved by the semiconductor integrated circuit, wherein the length of sides of at least one input/output cell region parallel to a respective orientation direction of the plurality of input/output cell regions is different from the length of corresponding sides of other input/output cell regions.

The objects described above are also achieved by the semiconductor integrated circuit, wherein the length of sides of each input/output cell region parallel to a respective orientation direction of the plurality of input/output cell regions and a pitch of the plurality of pads, respectively, are a multiple of a predetermined length.

According to the above semiconductor integrated circuit, it becomes easy to connect input/output cells when fine patterning of the input/output cell regions is desired without changing the pitch of the plurality of pads.

The objects described above are also achieved by the semiconductor integrated circuit, wherein each input/output cell region is provided so as to make the side facing the plurality of pads aligned with the corresponding side of adjacent input/output cell region(s).

The objects described above are also achieved by the semiconductor integrated circuit, wherein each input/output cell region is provided so as to make the side facing the inner cell region aligned with the corresponding side of adjacent input/output cell region(s).

The objects described above are also achieved by the semiconductor integrated circuit, wherein each input/output cell region is provided so as to make the side facing the plurality of pads and the side facing the inner cell region non-aligned with the corresponding side of adjacent input/output cell region(s).

According to the above semiconductor integrated circuit, the entire surface of the semiconductor chip may be used efficiently and effectively and it becomes possible to increase the area which may be assigned to the inner cell region provided that the surface area of the semiconductor chip is unchanged, or to reduce the surface area of the semiconductor chip provided that the area of the inner cell region is unchanged.

The objects described above are achieved by a method for making a wiring layout of a semiconductor integrated circuit comprising a step of; making a layout of a wiring pattern using input/output cells, each of which has a wiring pattern required only for itself and a structure which may be used to make a layout of wiring patterns connecting to other input/output cells.

According to the above semiconductor integrated circuit, since a layout of a wiring pattern is made using input/output cells, each of which has a wiring pattern required only for itself and a structure which may be used to make a layout of wiring patterns connecting to other input/output cells if necessary, the flexibility in the layout of wiring patterns may be increased. Thus, it becomes easy to carry out a wiring layout operation and to confirm a match of a circuit structure of an input/output cell with a physical pattern.

The objects described above are also achieved by the method for making the wiring layout of the semiconductor integrated circuit, further comprising a step of using at least one input/output cell which does not have a wiring pattern as an input/output cell.

According to the above semiconductor integrated circuit, since at least one cell which does not have a wiring pattern is used as well as the input/output cells, each of which has a wiring pattern required only for itself and a structure which may be used to make a layout of wiring patterns connecting to other input/output cells, the flexibility in the layout of wiring patterns may be further increased and it becomes easy to carry out a wiring layout operation and to confirm a match of a circuit structure of an input/output cell with a physical pattern.

Other objects and further features of the present invention will be apparent from the following detailed description when read in conjunction with the accompanied drawings.

BRIEF DESCRIPTION OF THE DRAWINGS

FIGS. 15A through 15G are schematic diagrams for explaining a method for making a wiring layout of a semiconductor integrated circuit according to an embodiment of the present invention;

DETAILED DESCRIPTION OF THE PREFERRED EMBODIMENTS

In the following, a principle and embodiments of the present invention will be described with reference to the accompanying drawings.

Figure 1:
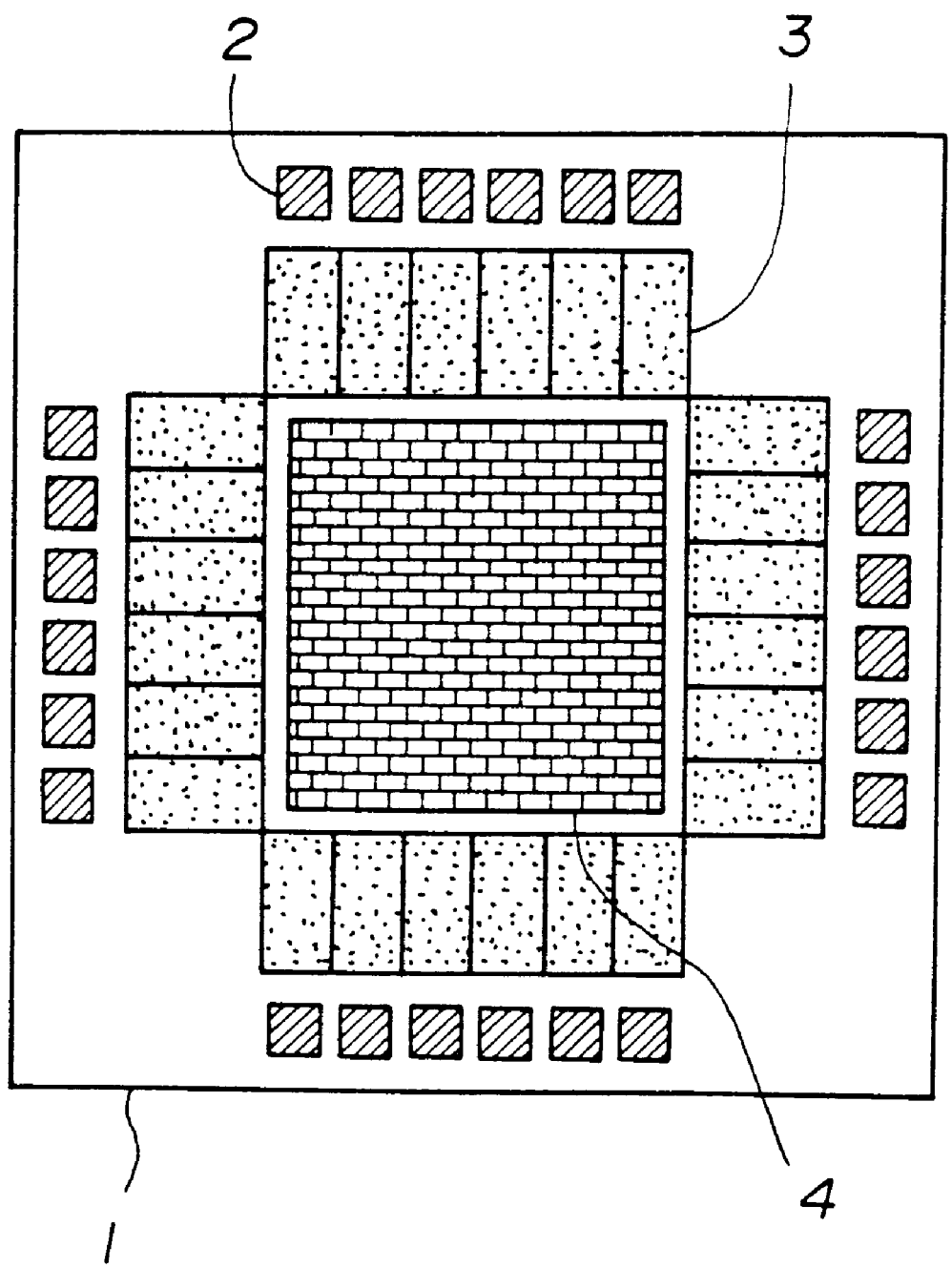
FIG. 1 is a schematic diagram showing a plan view of an embodiment of a conventional semiconductor integrated circuit.
Figure 2:
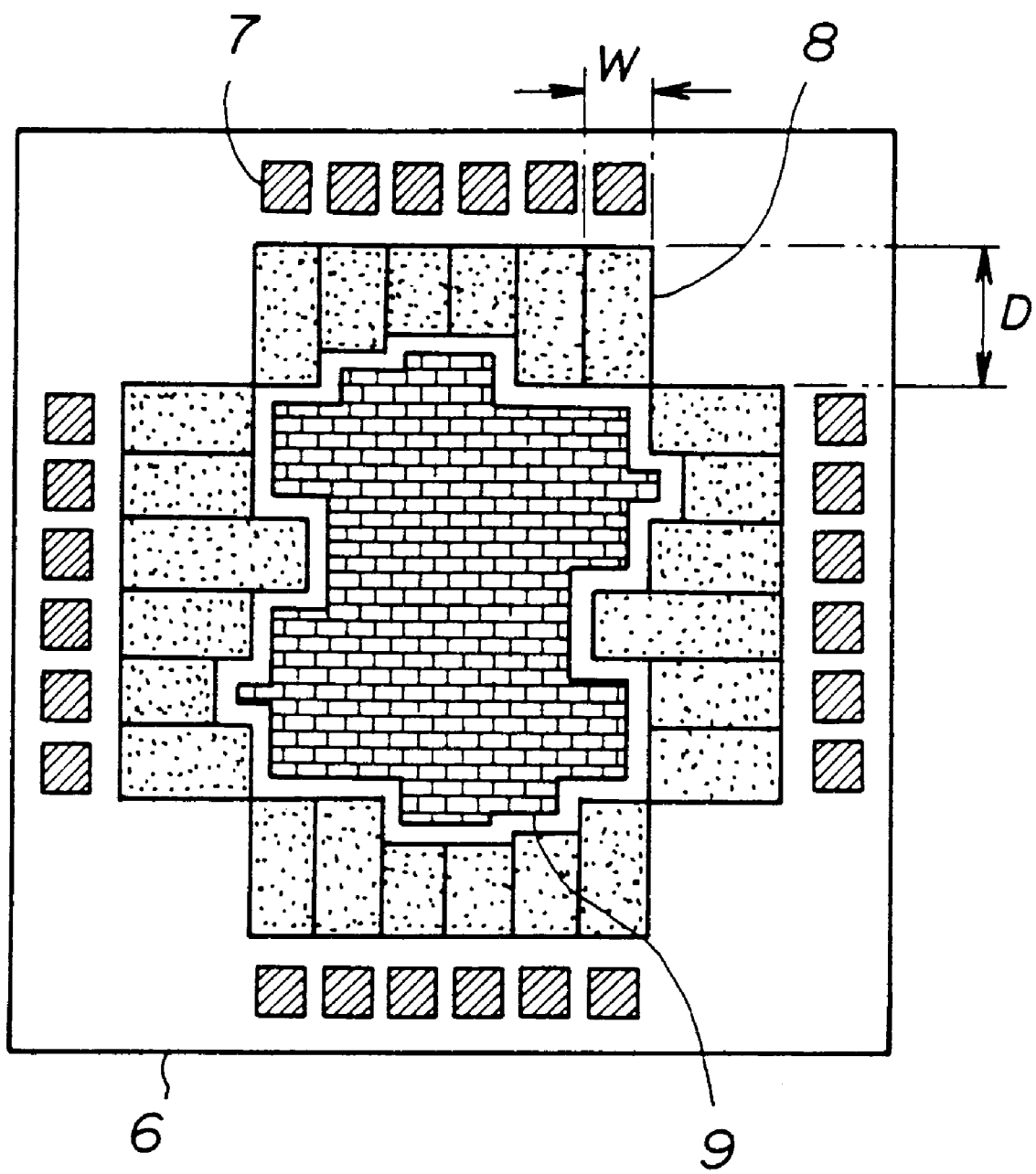
FIG. 2 is a schematic diagram showing a plan view of a semiconductor integrated circuit according to a first embodiment of the present invention.

(1) A semiconductor integrated circuit according to a first embodiment of the present invention:

FIG. 2 is a schematic diagram showing a plan view of the semiconductor integrated circuit according to the first embodiment of the present invention. The SIC is comprised of a semiconductor chip 6, a plurality of pads 7, a plurality of input/output cell regions 8, and an inner cell region 9.

As shown in FIG. 2, the SIC according to the first embodiment of the present invention is characterized by the plurality of I/O cell regions 8, each of which has an identical width W and a non-identical length D so that a proper area may be assigned to a particular I/O cell. In this embodiment, each of the I/O cell regions 8 is provided so as to make the side facing the pad 7 aligned with the adjacent I/O cell region(s) 8. Consequently, the shape of the inner cell region 9 becomes irregular (concavo-convex) as shown in the figure.

As mentioned above, according to the first embodiment of the present invention, since the area of each unit of the I/O cell regions 8 corresponds to the area required for a certain I/O cell, the area of the I/O cell regions 8 may be used efficiently and effectively.

Also, if the shape of the inner cell region 9 is arranged so that its circumference is provided substantially along the surrounding I/O cell regions 8, the entire surface of the semiconductor chip 6 may be used efficiently and effectively.

Thus, according to the first embodiment of the present invention, it becomes possible, compared with a conventional semiconductor chip, to increase the area assigned to the inner cell region provided that the surface area of the semiconductor chip is unchanged, or to reduce the surface area of the semiconductor chip provided that the area of the inner cell region is unchanged.

Figure 3:
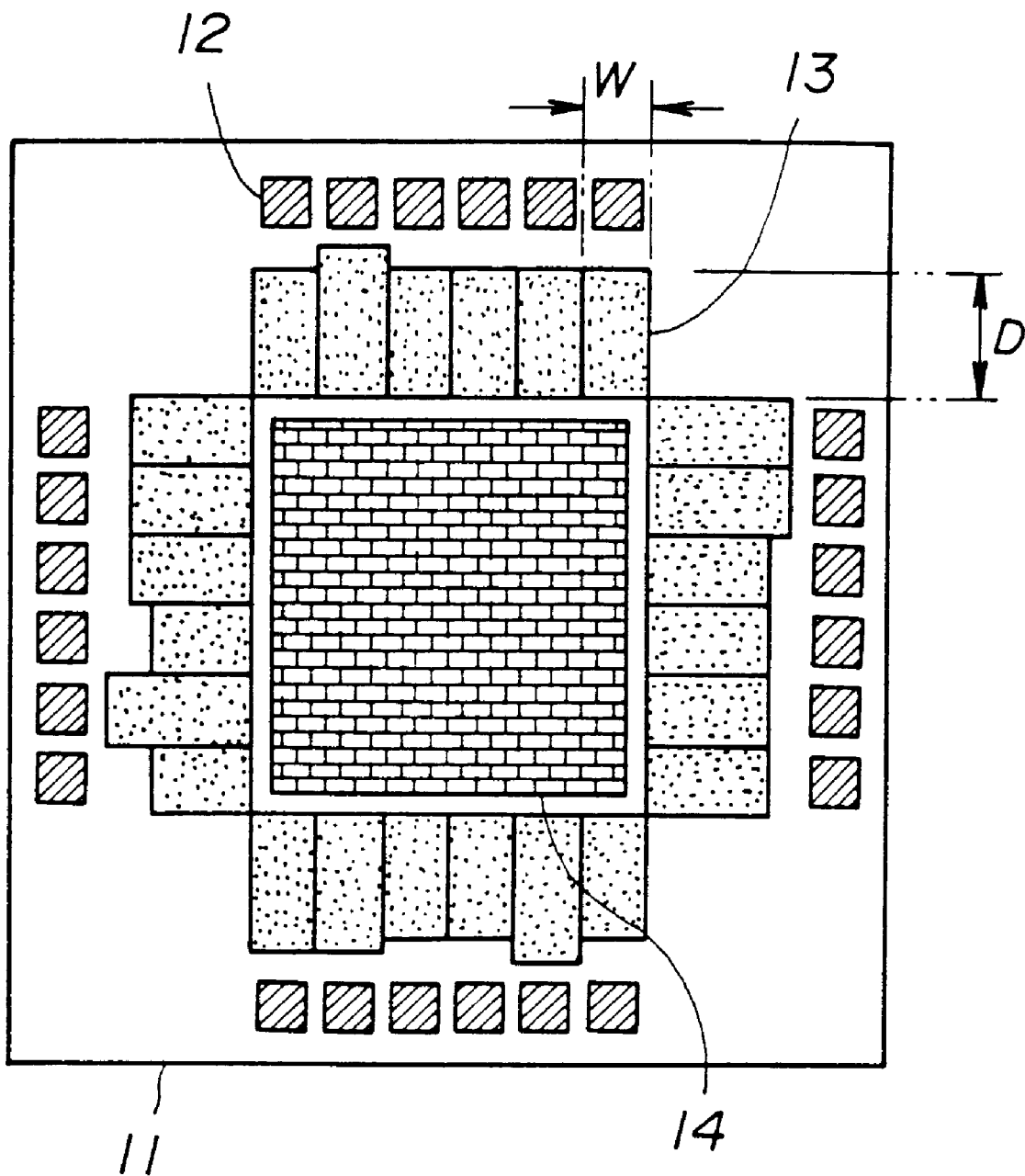
FIG. 3 is a schematic diagram showing a plan view of a semiconductor integrated circuit according to a second embodiment of the present invention.

(2) A semiconductor integrated circuit according to a second embodiment of the present invention:

FIG. 3 is a schematic diagram showing a plan view of the semiconductor integrated circuit according to the second embodiment of the present invention. The SIC is comprised of a semiconductor chip 11, a plurality of pads 12, a plurality of input/output cell regions 13, and an inner cell region 14.

As shown in FIG. 3, the SIC according to the second embodiment of the present invention is characterized by the plurality of I/O cell regions 13, each of which has an identical width W and a non-identical length D so that a proper area may be assigned to a particular I/O cell. The second embodiment is different from the first embodiment in that each of the I/O cell regions 13 is provided so as to make the side facing the inner cell region 14 aligned with the adjacent I/O cell region(s) 13. Consequently, the side of some of the I/O cell regions 13 facing the pad 12 is not aligned with the side of the adjacent I/O cell region(s) 13 as shown in the figure.

As mentioned above, according to the second embodiment of the present invention, since the area of each unit of the I/O cell regions 13 corresponds to the area required for a certain I/O cell, the area of the I/O cell regions 13 may be used efficiently and effectively.

Also, if the shape of the inner cell 14 is arranged so that its circumference is provided substantially along the surrounding I/O cell regions 13, the entire surface of the semiconductor chip 11 be used efficiently and effectively.

Thus, according to the second embodiment of the present invention, it becomes possible, compared with a conventional semiconductor chip, to increase the area assigned to the inner cell region provided that the surface area of the semiconductor chip is unchanged, or to reduce the surface area of the semiconductor chip provided that the area of the inner cell region is unchanged.

Figure 4:
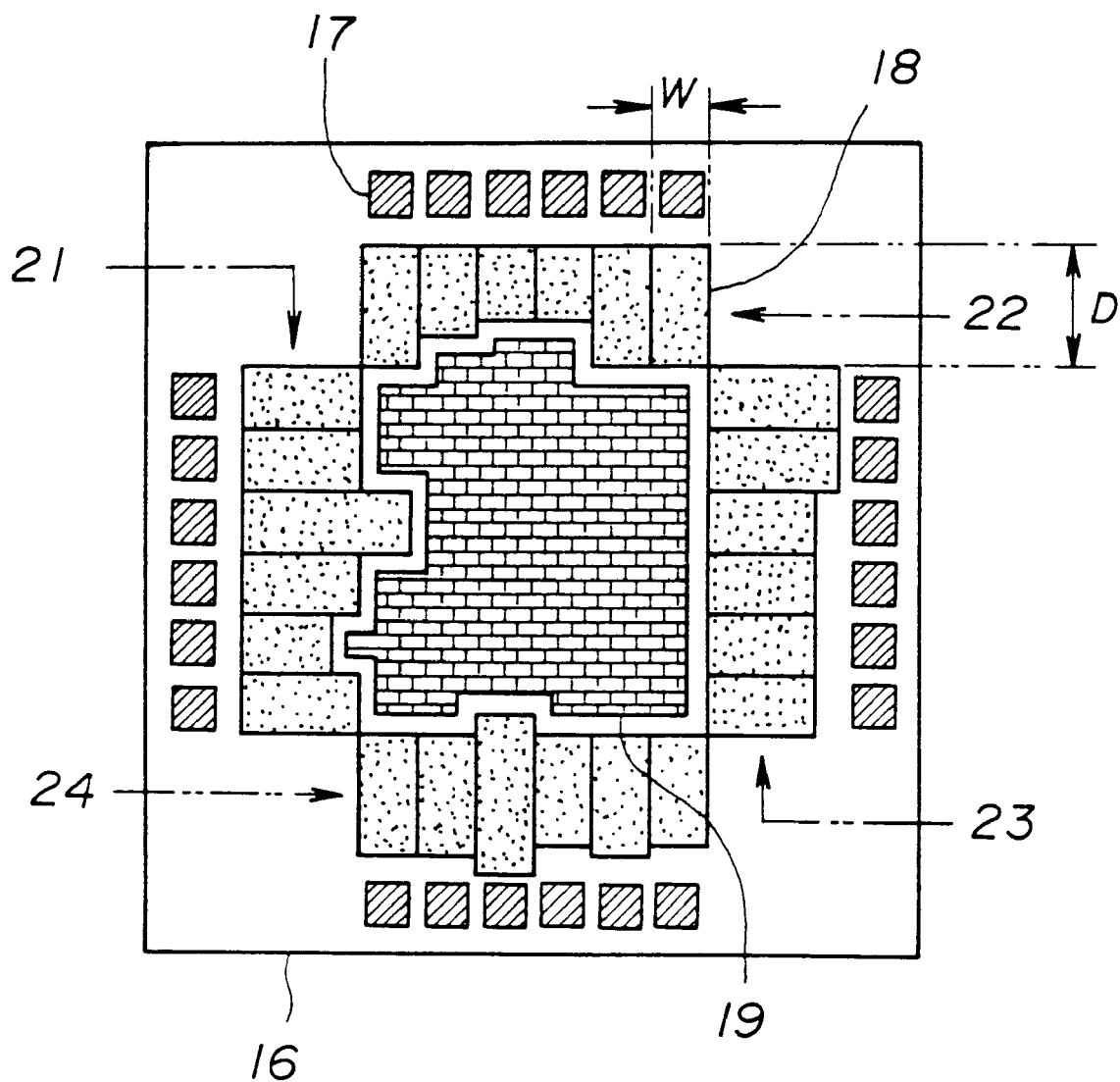
FIG. 4 is a schematic diagram showing a plan view of a semiconductor integrated circuit according to a third embodiment of the present invention.

(3) A semiconductor integrated circuit according to a third embodiment of the present invention:

FIG. 4 is a schematic diagram showing a plan view of the semiconductor integrated circuit according to the third embodiment of the present invention. The SIC is comprised of a semiconductor chip 16, a plurality of pads 17, a plurality of input/output cell regions 18, and an inner cell region 19.

As shown in FIG. 4, the SIC according to the third embodiment of the present invention is characterized by the plurality of I/O cell regions 13, each of which having an identical width W and a non-identical length D so that a proper area may be assigned to a particular I/O cell. The third embodiment is different from the first and second embodiments in that each of the I/O cell regions 18 in rows 21 and 22 is provided so as to make the side facing the pad 17 aligned with the adjacent I/O cell region(s) 18, each of the I/O cell regions 18 in row 23 is provided so as to make the side facing the inner cell region 19 aligned with the adjacent I/O cell region(s) 18, and some of the I/O cell regions 18 in row 24 are provided so as not to make the side facing the pad 17 and/or the side facing the inner cell region 19 aligned with the adjacent I/O cell region(s) 18.

As mentioned above, according to the third embodiment of the present invention, since the area of each unit of the I/O cell regions 18 corresponds to the area required for a certain I/O cell, the area of the I/O cell regions 18 may be used efficiently and effectively.

Also, if the shape of the inner cell 19 is arranged so that its circumference is provided substantially along the surrounding I/O cell regions 18, the entire surface of the semiconductor chip 16 may be used efficiently and effectively.

Thus, according to the third embodiment of the present invention, it becomes possible, compared with a conventional semiconductor chip, to increase the area assigned to the inner cell region provided that the surface area of the semiconductor chip is unchanged, or to reduce the surface area of the semiconductor chip provided that the area of the inner cell region is unchanged.

Figure 5:
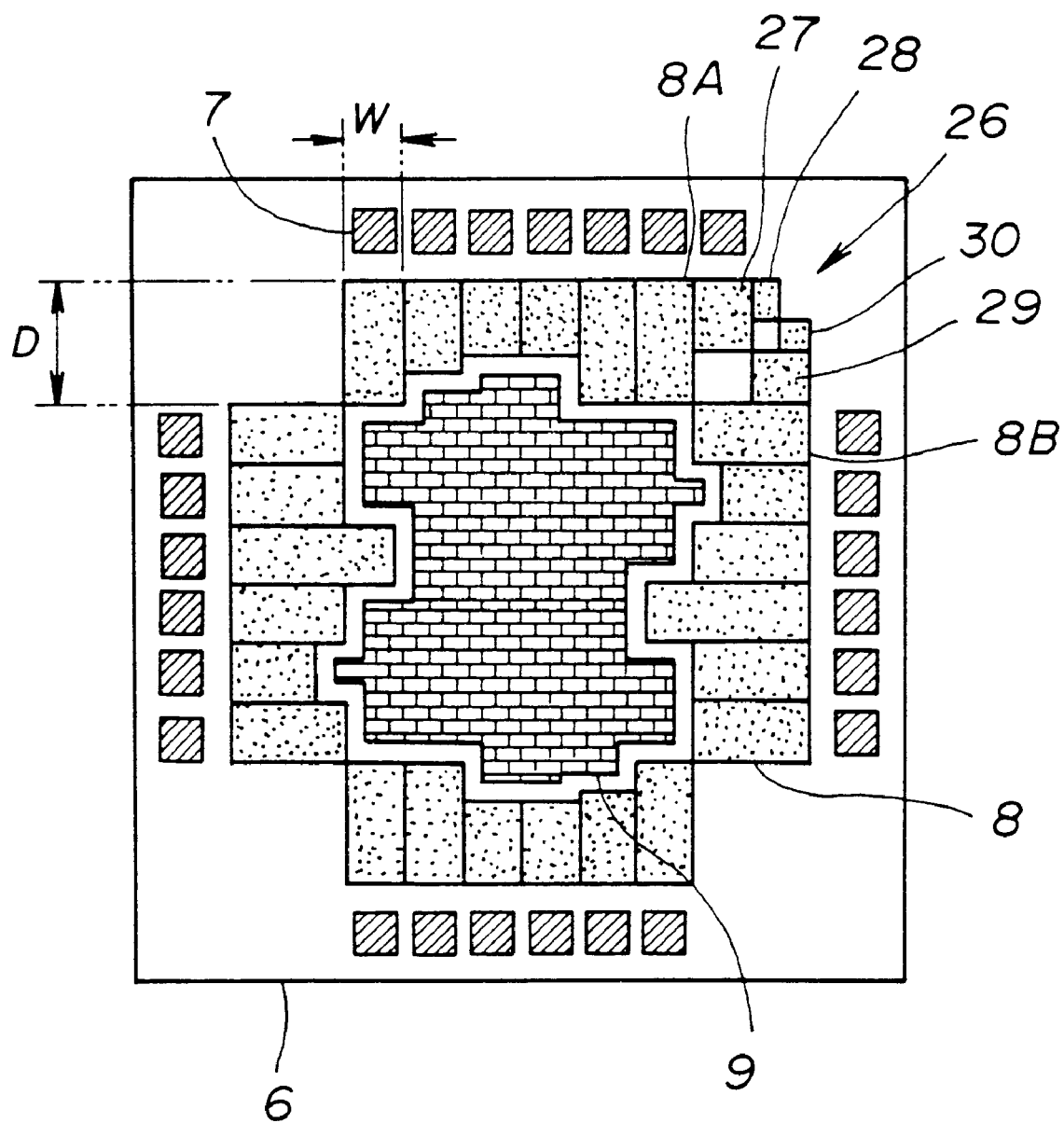
FIG. 5 is a schematic diagram showing a plan view of a semiconductor integrated circuit according to a fourth embodiment of the present invention.

(4) A semiconductor integrated circuit according to a fourth embodiment of the present invention:

FIG. 5 is a schematic diagram showing a plan view of the semiconductor integrated circuit according to the fourth embodiment of the present invention. The SIC is comprised of a semiconductor chip 6, a plurality of pads 7, a plurality of input/output cell regions 8, an inner cell region 9 and a plurality of corner input/output cell regions 27, 28, 29 and 30.

As shown in FIG. 5, the SIC according to the fourth embodiment of the present invention is different from the first embodiment due to the presence of the corner I/O cell regions 27 to 30 provided at a corner 26 of the semiconductor chip 6. The corner I/O cell regions 27, 28, 29 and 30 are provided so as to be partially surrounded by I/O cell regions 8A and 8B as shown in the figure.

According to the fourth embodiment of the present invention, the entire surface of the semiconductor chip 6 may be used efficiently and effectively.

Thus, it becomes possible, compared with a conventional semiconductor chip, to increase the area assigned to the inner cell region provided that the surface area of the semiconductor chip is unchanged, or to reduce the surface area of the semiconductor chip provided that the area of the inner cell region is unchanged. In addition, it becomes possible to increase the number and the area of input/output cell regions.

Figure 6:
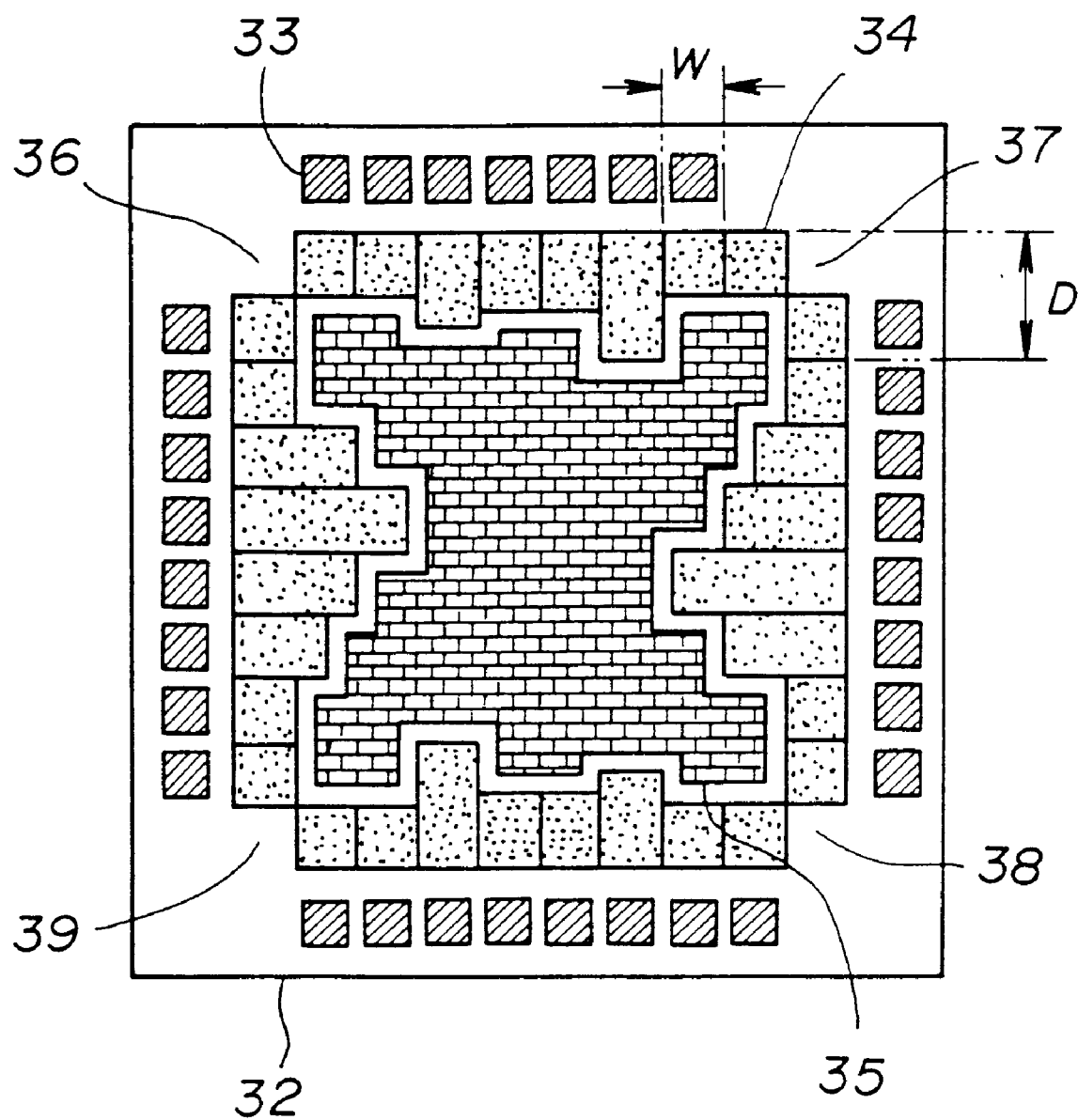
FIG. 6 is a schematic diagram showing a plan view of a semiconductor integrated circuit according to a fifth embodiment of the present invention.

(5) A semiconductor integrated circuit according to a fifth embodiment of the present invention:

FIG. 6 is a schematic diagram showing a plan view of the semiconductor integrated circuit according to the fifth embodiment of the present invention. The SIC is comprised of a semiconductor chip 32, a plurality of pads 33, a plurality of input/output cell regions 34, and an inner cell region 35.

As shown in FIG. 6, the SIC according to the fifth embodiment of the present invention is characterized by the plurality of I/O cell regions 34, each of which having an identical width W and a non-identical length D, which are provided so as to make the side of each of the I/O cell regions 34 facing the pad 33 aligned with the adjacent I/O cell region(s) 34, and an I/O cell region having a short length D is located so as to be facing corners 36, 37, 38 and 39, respectively. Consequently, the shape of the inner cell region 35 becomes irregular (concavo-convex) as shown in the figure.

According to the fifth embodiment of the present invention, since the area of each unit of the I/O cell regions 34 corresponds to the area required for a certain I/O cell and an I/O cell region having short length D is located so as to be facing corners 36, 37, 38 and 39, respectively, the area of the I/O cell regions 34 may be used efficiently and effectively.

Also, if the shape of the inner cell 35 is arranged so that its circumference is provided substantially along the surrounding I/O cell regions 34, the entire surface of the semiconductor chip 32 may be used efficiently and effectively.

Thus, according to the fifth embodiment of the present invention, it becomes possible, compared with a conventional semiconductor chip, to increase the area assigned to the inner cell region provided that the surface area of the semiconductor chip is unchanged, or to reduce the surface area of the semiconductor chip provided that the area of the inner cell region is unchanged. In addition, it becomes possible to increase the number of input/output cells.

FIGS. 7 through 10 are diagrams for explaining methods for utilizing a corner of a semiconductor chip. In FIGS. 7 through 10, a semiconductor chip 41 includes a plurality of pads 42, a plurality of input/output cell regions 43 through 54 and a corner 55 of the semiconductor chip 41.

Figure 7:
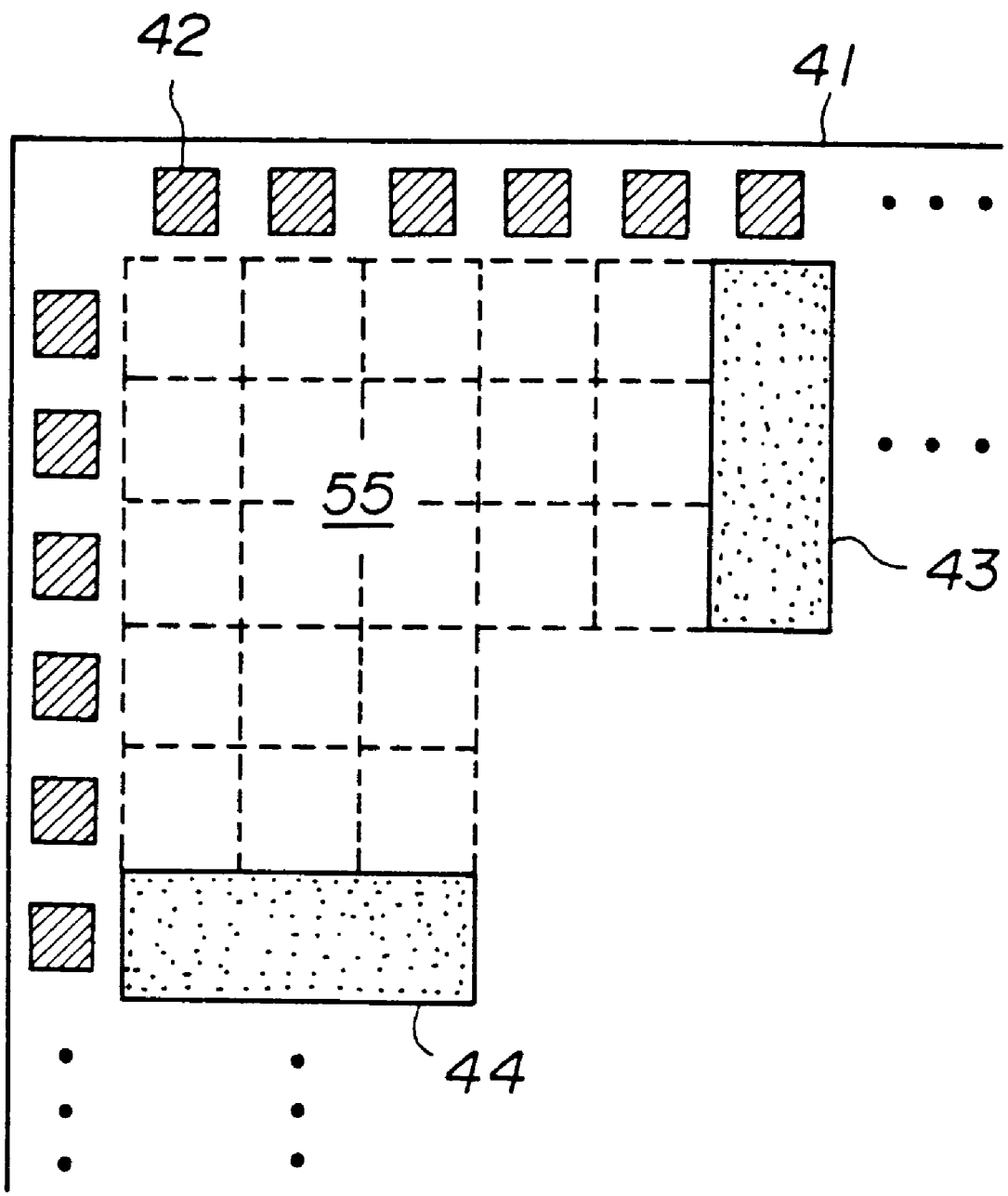
FIG. 7 is a schematic diagram for explaining a method for utilizing a corner of a semiconductor chip with I/O cell regions.
Figure 8:
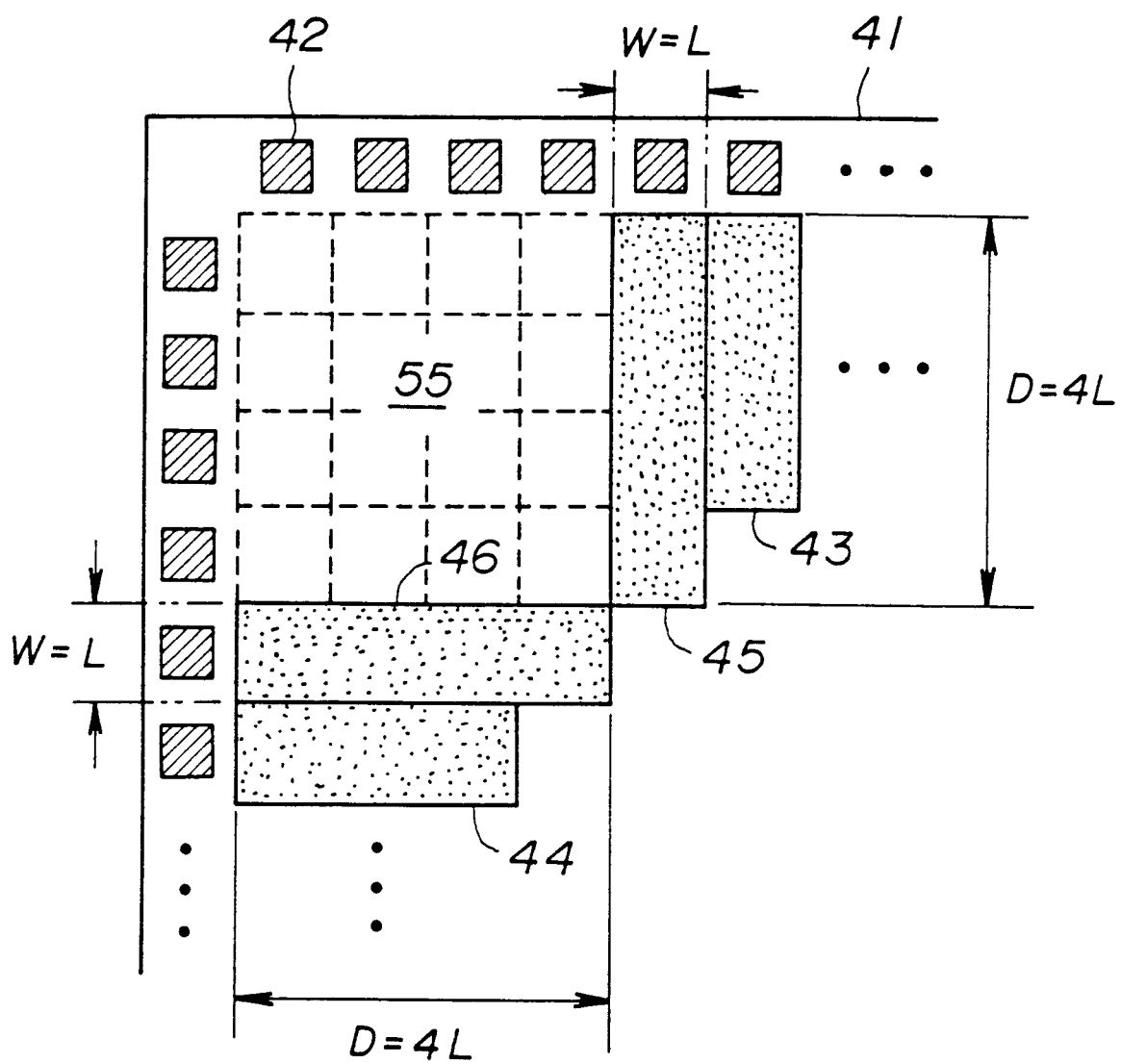
FIG. 8 is a schematic diagram for explaining a method for utilizing a corner of a semiconductor chip with I/O cell regions.
Figure 9:
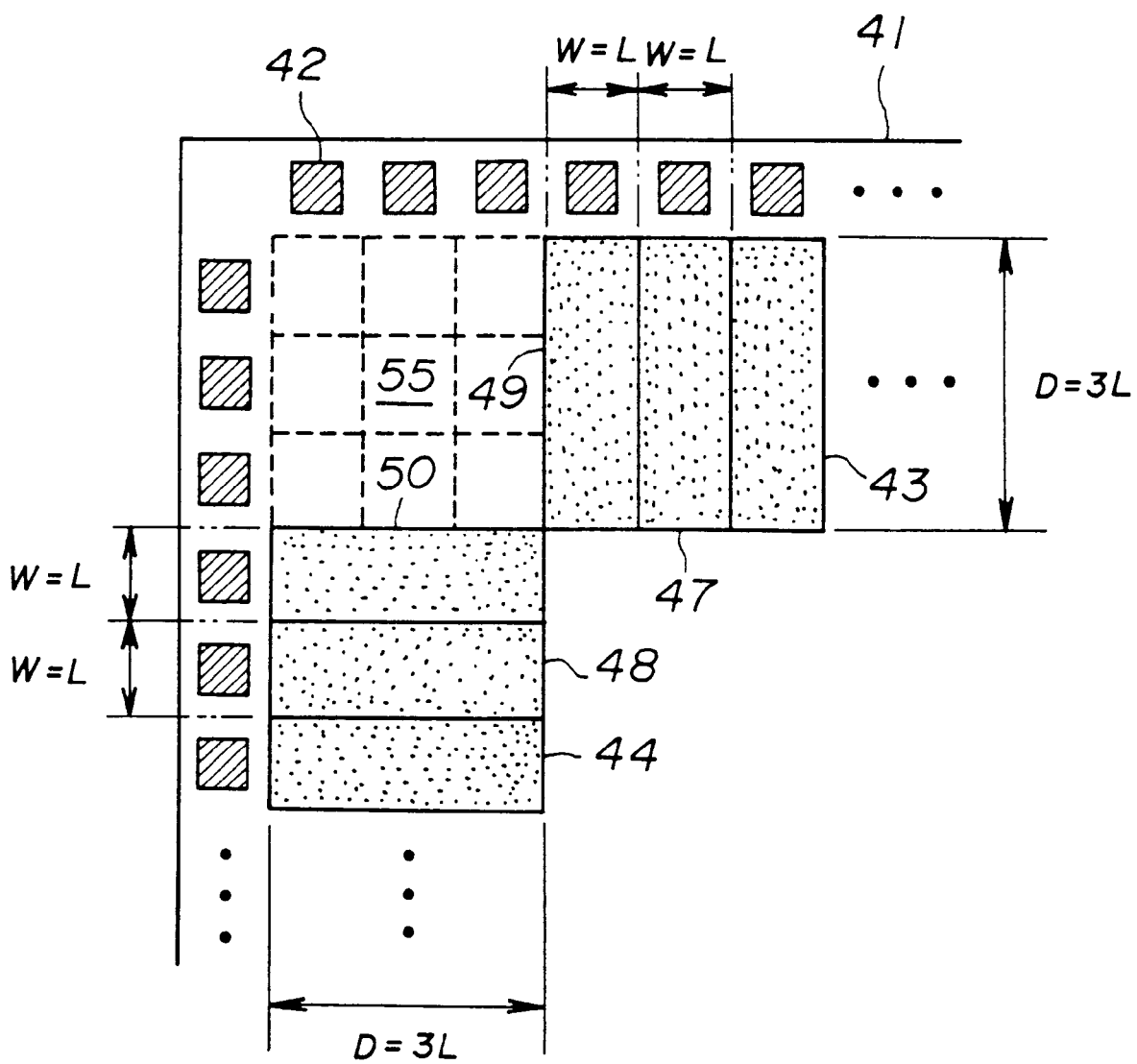
FIG. 9 is a schematic diagram for explaining a method for utilizing a corner of a semiconductor chip with I/O cell regions.
Figure 10:
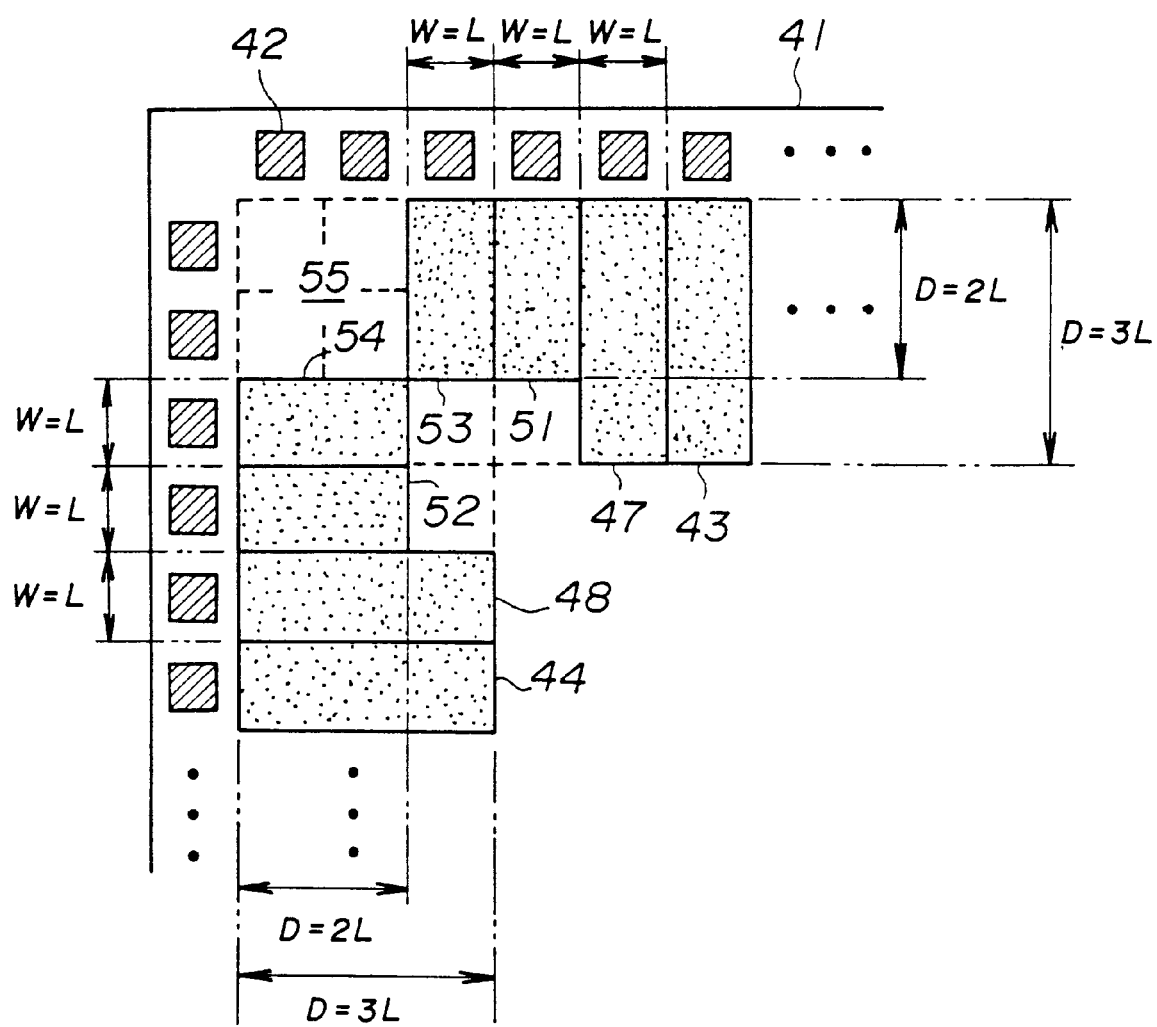
FIG. 10 is a schematic diagram for explaining a method for utilizing a corner of a semiconductor chip with I/O cell regions.

FIG. 7 is a schematic diagram showing the semiconductor chip 41 in which no I/O cell regions are provided at the corner 55. FIG. 8 is a schematic diagram showing the semiconductor chip 41 in which two I/O cell regions 45 and 46, each of which having a width W of L and a length D of 4L, are provided at the corner 55. FIG. 9 is a schematic diagram showing the semiconductor chip 41 in which four I/O cell regions 47, 48, 49 and 50, each of which having a width W of L and a length D of 3L, are provided at the corner 55. FIG. 10 is a schematic diagram showing the semiconductor chip 41 in which two I/O cell regions 47 and 48, each of which having a width W of L and a length D of 3L, and four I/O cell regions 51, 52, 53 and 54, each of which having a width W of L and a length D of 2L, are provided at the corner 55.

As shown in the figures, the total area of the I/O cell regions may be increased by providing I/O cell regions, each of which has a short length D, at the corners of the semiconductor chip.

Figure 11A:
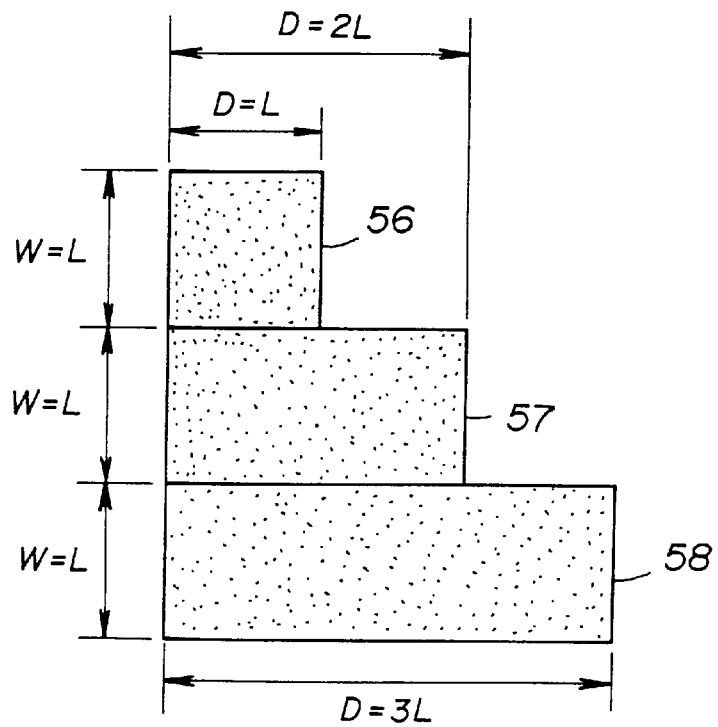
FIGS. 11A and 11B are schematic diagrams showing patterns of I/O cell regions which may be suitably applied to the semiconductor integrated circuit according to the fifth embodiment of the present invention.
Figure 11B:
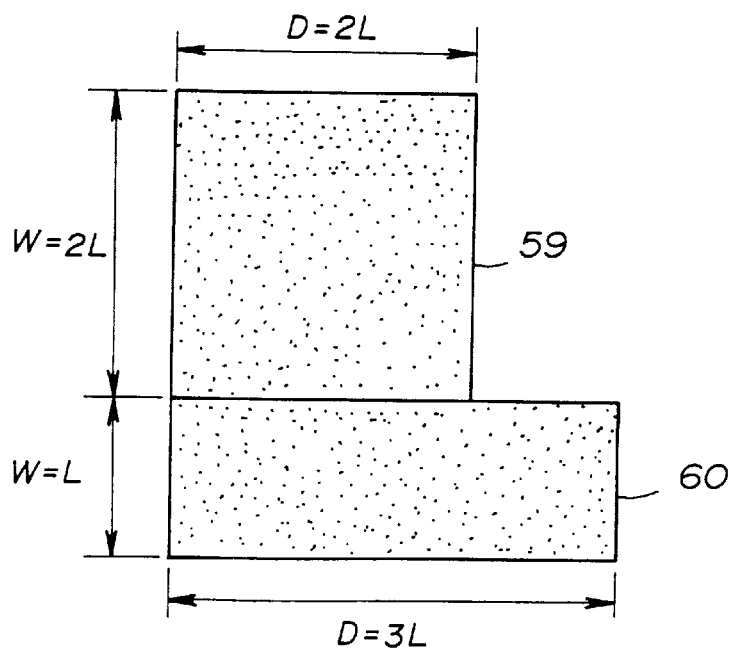

FIGS. 11A and 11B are schematic diagrams showing patterns of I/O cell regions which may be suitably applied to the SIC according to the fifth embodiment of the present invention.

In FIG. 11A, an I/O cell region 56 has a width W of L and a length D of L, an I/O cell regions 57 has a width W of L and a length D of 2L, and an I/O cell region 58 has a width W of L and a length D of 3L.

In FIG. 11B, an I/O cell region 59 has a width W of 2L and a length D of 2L, and an I/O cell region 60 has a width W of L and a length D of 3L.

As can be seen from the above figures, when a plurality of I/O cell regions, each of which has a length D that is a multiple of a width W (i.e., D=W×integer), it is possible to efficiently use the corners of the semiconductor chip even if the width of each I/O cell region is not identical. Accordingly, it is easy to make an automatic arrangement of I/O cell regions using such a device as a CAD.

Figure 12A:
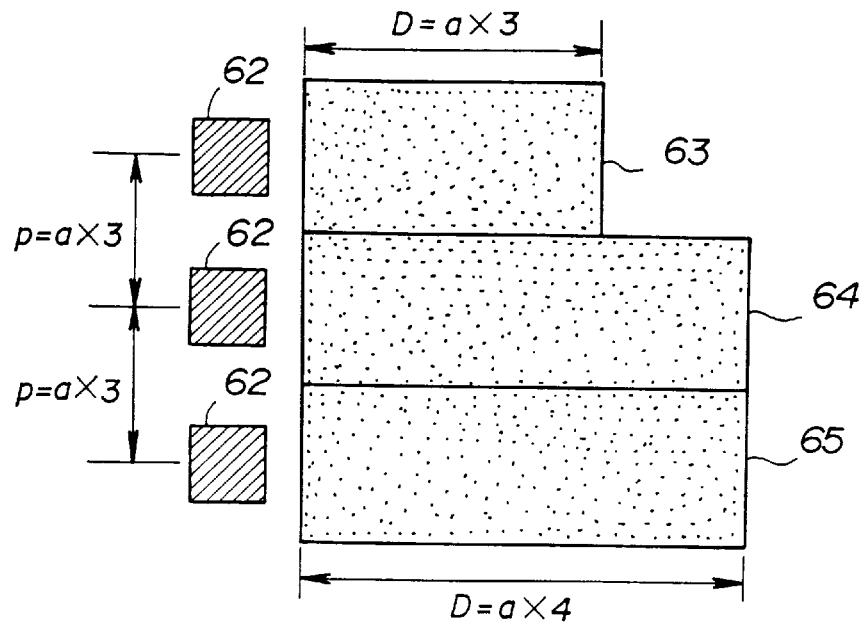
FIGS. 12A and 12B are schematic diagrams for explaining the positional relationship between the length D of I/O cell regions and a pitch P of a plurality of pads which may be suitably applied to the semiconductor integrated circuit according to the fifth embodiment of the present invention.
Figure 12B:
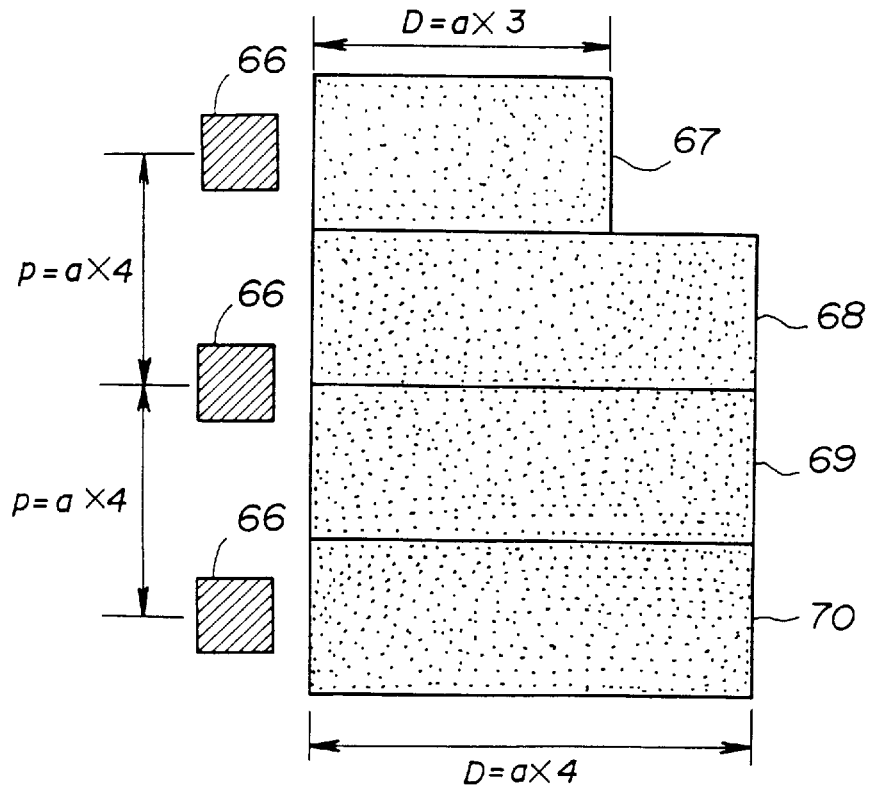

FIGS. 12A and 12B are schematic diagrams for explaining the positional relationship between the length D of I/O cell regions and a pitch P of a plurality of pads which may be suitably applied to the SIC according to the fifth embodiment of the present invention.

In FIG. 12A, an I/O cell region 63 has a length D of a×3, and I/O cell regions 64 and 65, respectively, have a length D of a×4. A plurality of pads 62 are provided with a pitch equivalent to a×3.

In FIG. 12B, an I/O cell region 67 has a length D of a×3, and I/O cell regions 68, 69 and 70, respectively, have a length D of a×4. A plurality of pads 66 are provided with a pitch equivalent to a×4.

As can be seen from the above figures, when there is a relationship between the length D and the pitch P that both of them are multiples of 'a' (in other words, a is the greatest common divisor of the length D and the pitch P), it is easy to connect a pad with an I/O cell and it is not necessary to change the pitch P between the pads.

Figure 13:
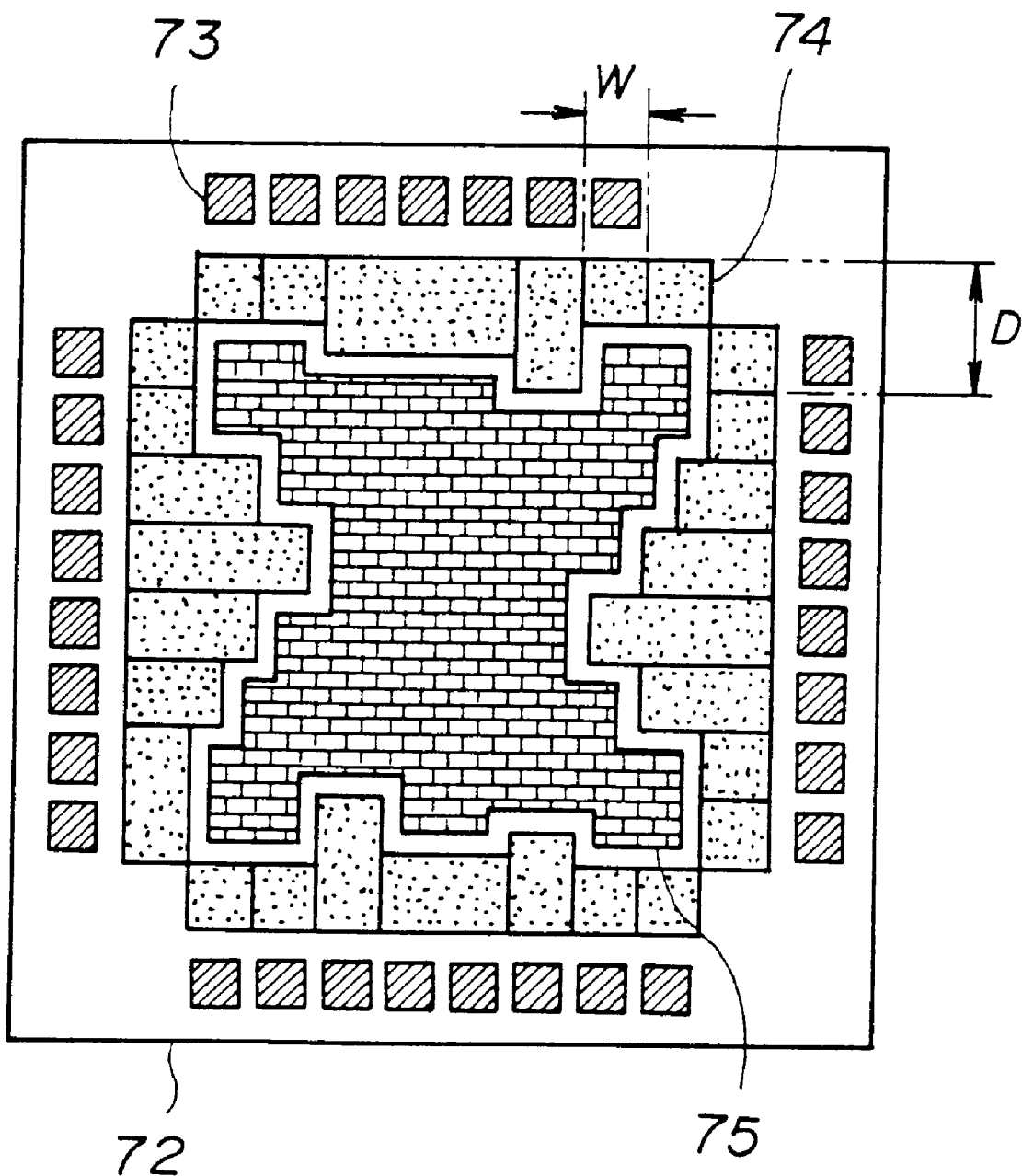
FIG. 13 is a schematic diagram showing a plan view of a semiconductor integrated circuit according to a sixth embodiment of the present invention.

(6) A semiconductor integrated circuit according to a sixth embodiment of the present invention:

FIG. 13 is a schematic diagram showing a plan view of the semiconductor integrated circuit according to the sixth embodiment of the present invention. The SIC is comprised of a semiconductor chip 72, a plurality of pads 73, a plurality of input/output cell regions 74, and an inner cell region 75.

As shown in FIG. 13, the SIC according to the sixth embodiment of the present invention is characterized by the plurality of I/O cell regions 74, some of which having non-identical widths W and non-identical lengths D, being provided so as to make the side of each of the I/O cell regions 74 facing the pad 73 aligned with the adjacent I/O cell region(s) 74. Consequently, the shape of the inner cell region 75 becomes irregular (concavo-convex) as shown in the figure.

According to the sixth embodiment of the present invention, since the area of each unit of the I/O cell regions 74 corresponds to the area required for a certain I/O cell, the area of the I/O cell regions 74 may be used efficiently and effectively.

Also, if the shape of the inner cell 75 is arranged so that its circumference is provided substantially along the surrounding I/O cell regions 74, the entire surface of the semiconductor chip 72 may be used efficiently and effectively.

Thus, according to the sixth embodiment of the present invention, it becomes possible, compared with a conventional semiconductor chip, to increase the area assigned to the inner cell region provided that the surface area of the semiconductor chip is unchanged, or to reduce the surface area of the semiconductor chip provided that the area of the inner cell region is unchanged.

Figure 14A:
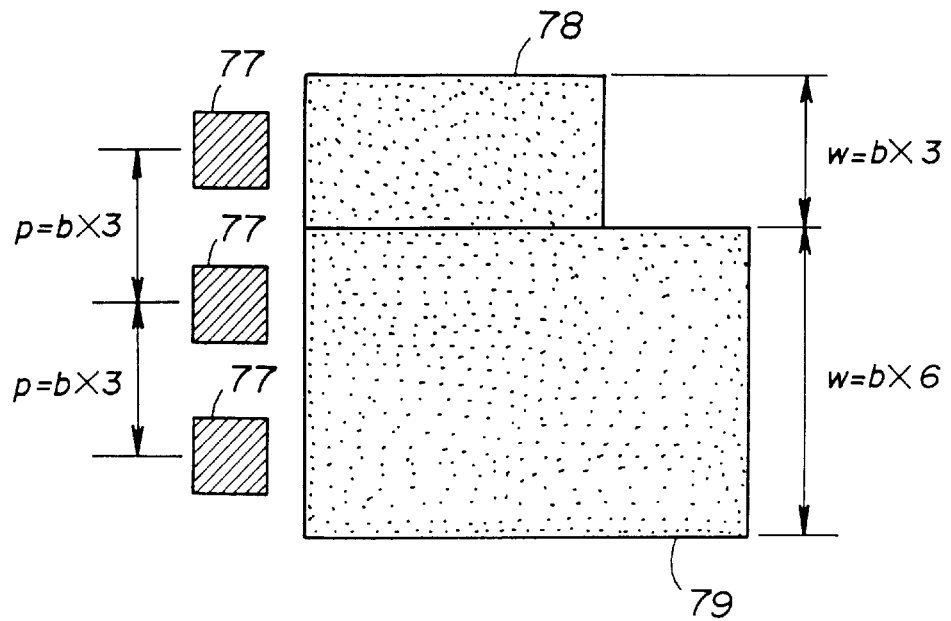
FIGS. 14A and 14B are schematic diagrams for explaining the positional relationship between the width W of I/O cell regions and a pitch P of a plurality of pads which may be suitably applied to the semiconductor integrated circuit according to the sixth embodiment of the present invention.
Figure 14B:
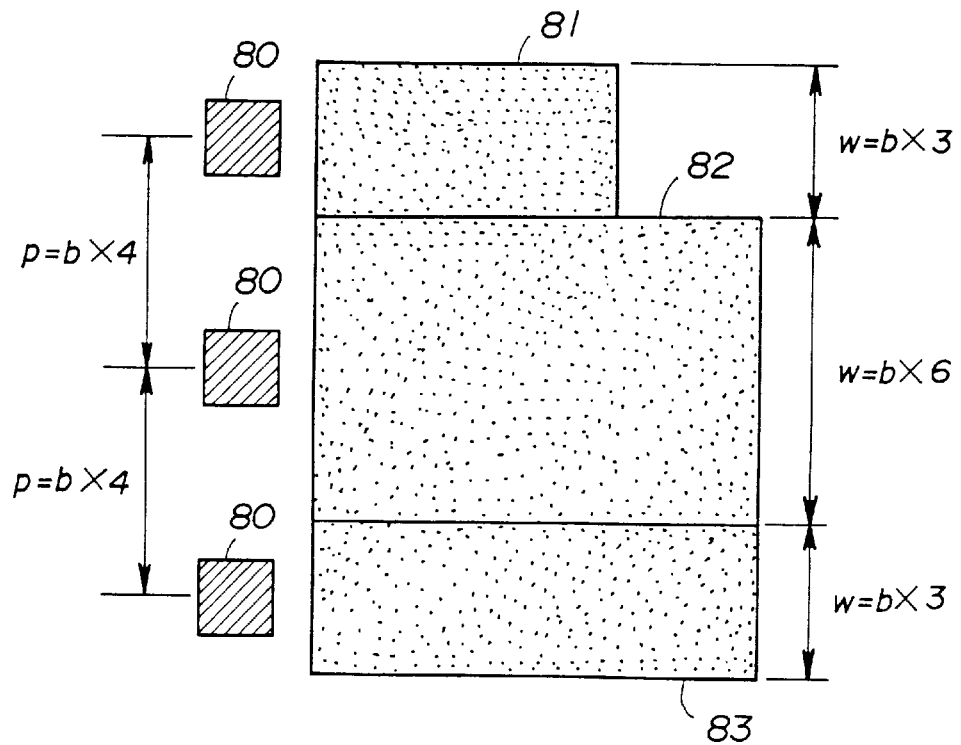

FIGS. 14A and 14B are schematic diagrams for explaining the positional relationship between the width W of I/O cell regions and a pitch P of a plurality of pads which may be suitably applied to the SIC according to the sixth embodiment of the present invention.

In FIG. 14A, an I/O cell region 78 has a width W of b×3, and an I/O cell region 79 has a width W of b×6. A plurality of pads 77 are provided with a pitch equivalent to b×3.

In FIG. 14B, an I/O cell region 81 has a width W of b×3, an I/O cell region 82 has a width W of b×6, and an I/O cell region 83 has a width W of b×3. A plurality of pads 80 are provided with a pitch equivalent to b×4.

As can be seen from the above figures, when there is a relationship between the width W and the pitch P that both of them are multiples of 'b' (in other words, b is the greatest common divisor of the width W and the pitch P), it is easy to connect a pad with an I/O cell and it is not necessary to change the pitch P between the pads.

(7) A method for making a wiring layout of a semiconductor integrated circuit according to an embodiment of the present invention:

FIGS. 15A through 15G are schematic diagrams for explaining a method for making a wiring layout of a semiconductor integrated circuit according to an embodiment of the present invention. In FIGS. 15A through 15G, input/output cells 85, 86, 87, 88, 89, 90 and 91, respectively, which are used for the method for making a wiring layout of a semiconductor integrated circuit according to the present invention, are shown.

The I/O cell 85 shown in FIG. 15A is comprised of a VDD power source wiring pattern 92, a VSS power source wiring pattern 93, an Si signal wiring pattern 94, and an S2 signal wiring pattern 95. The I/O cell 86 shown in FIG. 15B is comprised of a VDD power source wiring pattern 92, a VSS power source wiring pattern 93, and an Si signal wiring pattern 94.

The I/O cell 87 shown in FIG. 15C has no wiring pattern and the I/O cell 88 shown in FIG. 15D is comprised of a VDD power source wiring pattern 92, and a VSS power source wiring pattern 93.

The I/O cell 89 shown in FIG. 15E is comprised of VDD power source wiring patterns 92 and 96, a VDD power source wiring pattern 93, an S1 signal wiring pattern 94, and an S2 signal wiring pattern 95.

The I/O cell 90 shown in FIG. 15F is comprised of a VDD power source wiring pattern 92, and a VSS power source wiring pattern 93, and the I/O cell 91 shown in FIG. 15G is comprised of VDD power source wiring patterns 92 and 96, and a VSS power source wiring pattern 93.

Figure 16:
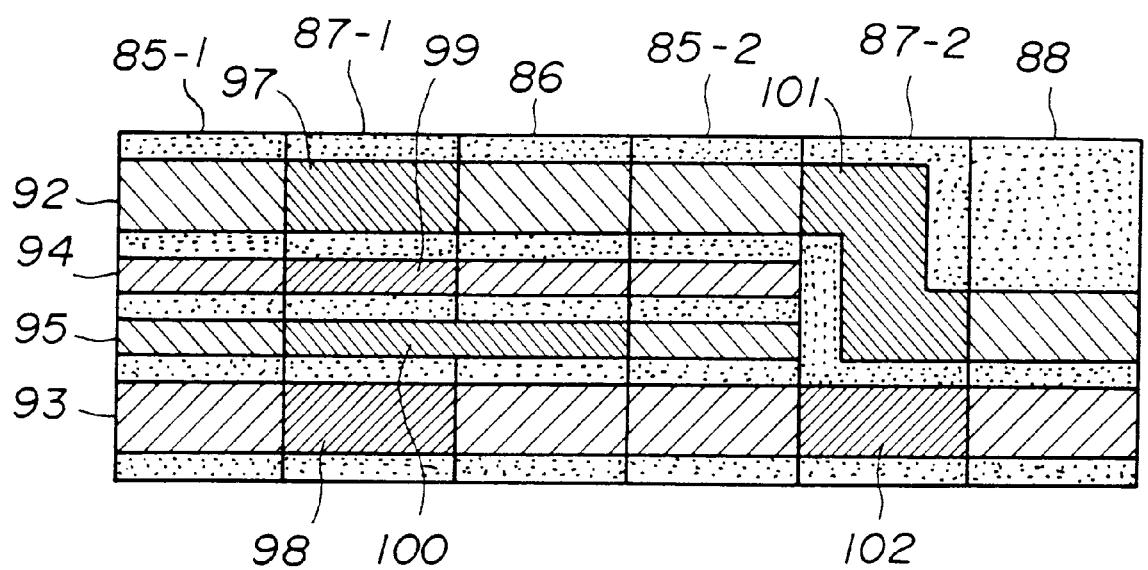
FIG. 16 is a diagram showing an embodiment of a wiring layout according to the present invention.

FIG. 16 is a diagram showing an embodiment of a wiring layout in which the I/O cells 85 (85-1 and 85-2), 86, 87 (87-1 and 87-2) and 88 shown in FIGS. 15A, 15B, 15C and 15D, respectively, are arranged in one row.

In this embodiment, wiring patterns 97, 98, 99, 100, 101 and 102 are included in addition to the wiring patterns provided with the I/O cells 85, 86 and 88.

In the arrangement shown in FIG. 16, the VDD power source wiring pattern 92 of the I/O cell 85-1, the VDD power source wiring pattern 92 of the I/O cell 86, the VDD power source wiring pattern 92 of the I/O cell 85-2, and the VDD power source wiring pattern 92 of the I/O cell 88 are connected via the wiring patterns 97 and 101.

Also, the VSS power source wiring pattern 93 of the I/O cell 85-1, the VSS power source wiring pattern 93 of the I/O cell 86, the VSS power source wiring pattern 93 of the I/O cell 85-2, and the VSS power source wiring pattern 93 of the I/O cell 88 are connected via the wiring patterns 98 and 102.

Moreover, the Si signal wiring pattern 94 of the I/O cell 85-1, the S1 signal wiring pattern 94 of the I/O cell 86, and the S1 signal wiring pattern 94 of the I/O cell 85-2 are connected via the wiring pattern 99.

Further, the S2 signal wiring pattern 95 of the I/O cell 85-1 and the S2 signal wiring pattern 95 of the I/O cell 85-2 are connected via the wiring pattern 100.

Figure 17:
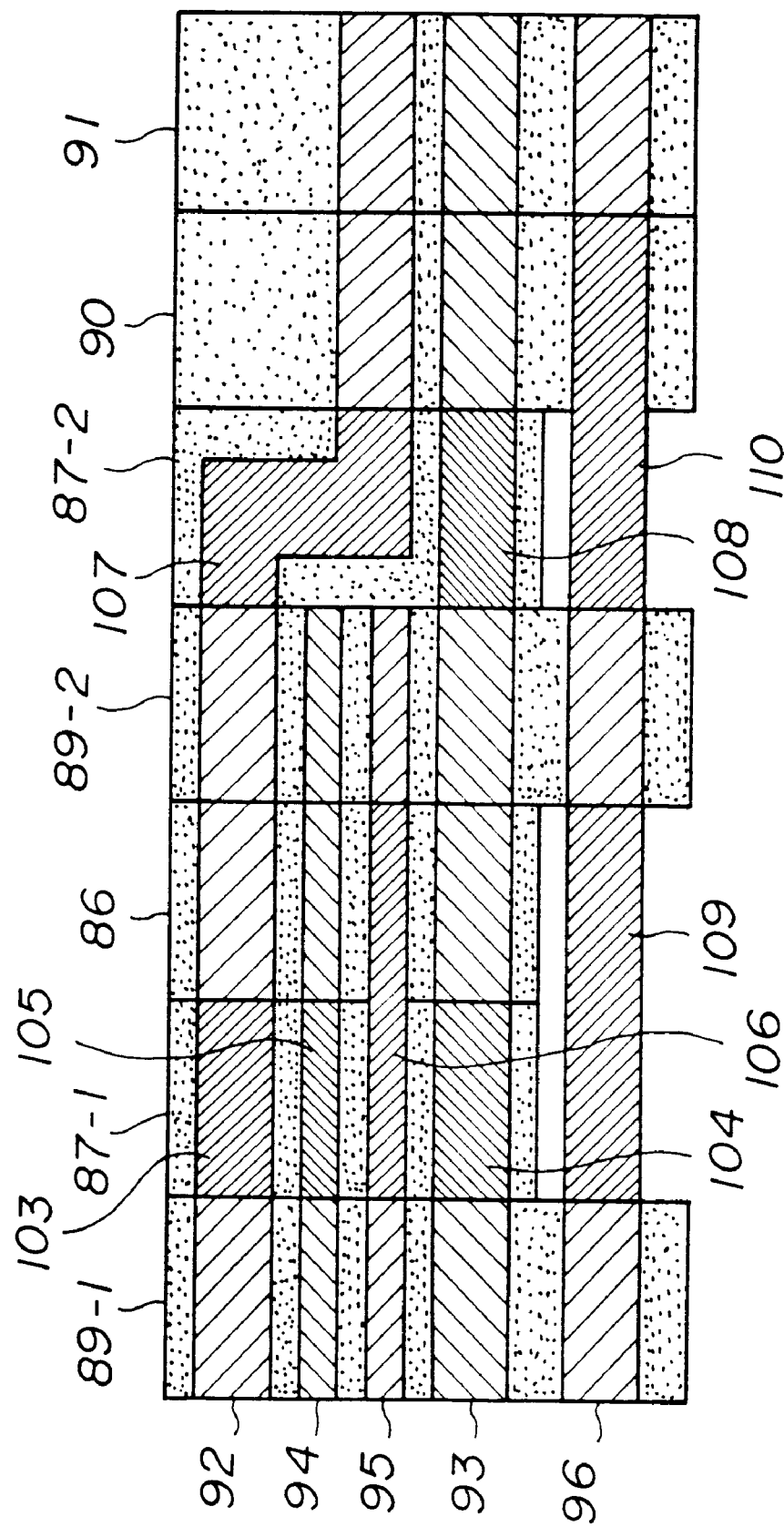
FIG. 17 is a diagram showing an embodiment of a wiring layout according to the present invention.

FIG. 17 is a diagram showing another embodiment of a wiring layout in which the I/O cells 86, 87 (87-1 and 87-2), 89 (89-1 and 89-2), 90 and 91 shown in FIGS. 15B, 15C, 15E, 15F and 15G, respectively, are arranged in one row.

In this embodiment, wiring patterns 103, 104, 105, 106, 107, 108, 109, and 110 are included in addition to the wiring patterns provided with the I/O cells 86, 89, 90 and 91.

In the arrangement shown in FIG. 17, the VDD power source wiring pattern 92 of the I/O cell 89-1, the VDD power source wiring pattern 92 of the I/O cell 86, the VDD power source wiring pattern 92 of the I/o cell 89-2, the VDD power source wiring pattern 92 of the I/O cell 90, and the VDD power source wiring pattern 92 of the I/O cell 91 are connected via the wiring patterns 103 and 107.

Also, the VSS power source wiring pattern 93 of the I/O cell 89-1, the VSS power source wiring pattern 93 of the I/O cell 86, the VSS power source wiring pattern 93 of the I/O cell 89-2, the VSS power source wiring pattern 93 of the I/O cell 90, and the VSS power source wiring pattern 93 of the I/O cell 91 are connected via the wiring patterns 104 and 108.

Moreover, the S1 signal wiring pattern 94 of the I/O cell 89-1, the S1 signal wiring pattern 94 of the I/O cell 86, and the S1 signal wiring pattern 94 of the I/O cell 89-2 are connected via the wiring pattern 105.

Further, the S2 signal wiring pattern 95 of the I/O cell 89-1 and the S2 signal wiring pattern 95 of the I/O cell 89-2 are connected via the wiring pattern 106.

In addition, the VDD power source wiring pattern 96 of the I/O cell 89-1, the VDD power source wiring pattern 96 of the I/O cell 89-2, and the VDD power source wiring pattern 96 of the I/O cell 91 are connected via the wiring patterns 109 and 110.

According to the above-mentioned embodiments of the wiring layout of the semiconductor integrated circuit, since the I/O cells 86, 89, 90 and 91, each of which has a wiring pattern required for itself and a structure which may be used to make a layout of wiring patterns connecting other I/O cells if necessary, and the I/O cell 87 which does not have a wiring pattern are used, the flexibility in the layout of wiring patterns may be increased. Thus, it becomes easy to carry out a wiring layout operation and to confirm a match of a circuit structure of an I/O cell with a physical pattern.

It is obvious that the present invention is not limited to the above-mentioned embodiments, and variations and modifications may be made without departing from the scope of the present invention.

What is claimed is:

1. A semiconductor integrated circuit comprising:
    a semiconductor chip:
    an inner cell region,
    a plurality of input/output cell regions which are located around said inner cell region, and
    a plurality of pads which are provided between said plurality of input/output cell regions and sides of said semiconductor chip, wherein each unit area of said plurality of input/output cell regions is assigned to a corresponding input/output cell so as to be just sufficient for said corresponding input/output cell, and wherein said input/output cell regions have respective lengths of sides thereof extending in a direction perpendicular to another direction in which the plurality of input/output cell regions are arranged such that a non-linear boundary is formed between the inner cell region and said input/output cell regions.

2. The semiconductor integrated circuit as claimed in claim 1, wherein additional input/output cell regions are provided in at least one corner of said semiconductor chip, said additional input/output cell regions being partially surrounded by input/output cell regions facing the corner.

3. The semiconductor integrated circuit as claimed in claim 1, wherein input/output cell regions whose length of sides perpendicular to a respective orientation direction of said plurality of input/output cell regions are shorter compared with the corresponding length of sides of other input/output cells are located so as to be facing a respective corner of said semiconductor chip.

4. The semiconductor integrated circuit as claimed in claim 1, wherein the length of sides of each input/output cell region perpendicular to a respective orientation direction of said plurality of input/output cell regions is substantially equal to a multiple of the length of sides of said each input/output cell region parallel to a respective orientation direction of said plurality of input/output cell regions.

5. The semiconductor integrated circuit as claimed in claim 1, wherein the length of sides of each input/output cell region parallel to a respective orientation direction of said plurality of input/output cell regions is substantially the same as each other.

6. The semiconductor integrated circuit as claimed in claim 5, wherein the length of sides of each input/output cell region perpendicular to a respective orientation direction of said plurality of input/output cell regions and a pitch of said plurality of pads, respectively, are a multiple of a predetermined length.

7. The semiconductor integrated circuit as claimed in claim 1, wherein the length of sides of at least one input/output cell region parallel to a respective orientation direction of said plurality of input/output cell regions is different from the length of corresponding sides of other input/output cell regions.

8. The semiconductor integrated circuit as claimed in claim 7, wherein the length of sides of each input/output cell region parallel to a respective orientation direction of said plurality of input/output cell regions and a pitch of said plurality of pads, respectively, are a multiple of a predetermined length.

9. The semiconductor integrated circuit as claimed in claim 1, wherein each input/output cell region is provided so as to make the side facing said plurality of pads aligned with the corresponding side of adjacent input/output cell region(s).

10. The semiconductor integrated circuit as claimed in claim 1, wherein each input/output cell region is provided so as to make the side facing said inner cell region aligned with the corresponding side of adjacent input/output cell region(s).

11. The semiconductor integrated circuit as claimed in claim 1, wherein each input/output cell region is provided so as to make the side facing said plurality of pads and the side facing said inner cell region non-aligned with the corresponding side of adjacent input/output cell region(s).

12. A method for making a wiring layout of a semiconductor integrated circuit comprising a step of:

making a layout of a wiring pattern using input/output cells, each of which having a wiring pattern required only for itself and a structure which may be used to make a layout of wiring patterns connecting to other input/output cells, and wherein said input/output cell regions have respective lengths of sides thereof extending in a direction perpendicular to another direction in which said plurality of input/output cell regions are arranged, such that a non-linear boundary is formed between the inner cell region and said input/out cell regions.

13. The method for making the wiring layout of the semiconductor integrated circuit as claimed in claim 12, further comprising the step of:

using at least one input/output cell which does not have a wiring pattern as an input/output cell.

* * * * *

UNITED STATES PATENT AND TRADEMARK OFFICE
CERTIFICATE OF CORRECTION

PATENT NO. : 6,013,924  
DATED : January 11, 2000  
INVENTOR(S) : Osajima et al.

Page 1 of 1

It is certified that error appears in the above-identified patent and that said Letters Patent is hereby corrected as shown below:

<u>Title page,</u>  
Item [22], the correct filing date should read -- Jun. 24, 1997 --

Signed and Sealed this

Sixteenth Day of April, 2002

*Attest:*

JAMES E. ROGAN  
*Attesting Officer*    *Director of the United States Patent and Trademark Office*